(12) United States Patent
Durlam et al.

(10) Patent No.: US 6,211,090 B1
(45) Date of Patent: Apr. 3, 2001

(54) METHOD OF FABRICATING FLUX CONCENTRATING LAYER FOR USE WITH MAGNETORESISTIVE RANDOM ACCESS MEMORIES

(75) Inventors: Mark Durlam, Chandler; Eugene Youjun Chen, Gilbert; Saied N. Tehrani; Jon Michael Slaughter, both of Tempe; Gloria Kerszykowski, Fountain Hills; Kelly Wayne Kyler, Mesa, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/528,971

(22) Filed: Mar. 21, 2000

(51) Int. Cl.⁷ .................................................. H01L 21/00
(52) U.S. Cl. .............................. 438/692; 216/22; 216/38; 438/741; 438/745; 438/754
(58) Field of Search ................................ 438/3, 131, 626, 438/631, 637, 645, 672, 692, 737, 741, 745, 754, 756, 757; 216/18, 22, 38, 88, 100; 365/98, 158, 171

(56) References Cited

U.S. PATENT DOCUMENTS

| | | | |
|---|---|---|---|
| 5,498,561 | * 3/1996 | Sakuma et al. | 216/22 X |
| 5,786,275 | * 7/1998 | Kubo | 216/38 X |
| 5,861,328 | 1/1999 | Tehrani et al. | 438/210 |
| 5,902,690 | 5/1999 | Tracy et al. | 428/693 |
| 5,990,011 | * 11/1999 | McTeer | 216/38 X |

* cited by examiner

Primary Examiner—William Powell
(74) Attorney, Agent, or Firm—William E. Koch

(57) ABSTRACT

A method of fabricating a flux concentrator for use in magnetic memory devices including the steps of providing at least one magnetic memory bit (10) and forming proximate thereto a material stack defining a copper (Cu) damascene bit line (56) including a flux concentrating layer (52). The method includes the steps of depositing a bottom dielectric layer (32), an optional etch stop (34) layer, and a top dielectric layer (36) proximate the magnetic memory bit (10). A trench (38) is etched in the top dielectric layer (36) and the bottom dielectric layer (32). A first barrier layer (42) is deposited in the trench (38). Next, a metal system (29) is deposited on a surface of the first barrier layer (42). The metal system (29) includes a copper (Cu) seed material (44), and a plated copper (Cu) material (46), a first outside barrier layer (50), a flux concentrating layer (52), and a second outside barrier layer (54). The metal system (29) is patterned and etched to define a copper (Cu) damascene bit line (56).

20 Claims, 5 Drawing Sheets

METHOD OF FABRICATING FLUX CONCENTRATING LAYER FOR USE WITH MAGNETORESISTIVE RANDOM ACCESS MEMORIES

FIELD OF THE INVENTION

The present invention pertains to methods of manufacturing high density, nonvolatile magnetic memories and more particularly to improved methods of fabricating magnetoresistive random access memory (MRAM) magnetic field programming lines that include an integrated flux concentrating layer for providing shielding and reducing bit switching current.

BACKGROUND OF THE INVENTION

The memory cells in MRAM devices are programmed by the magnetic field created from a current carrying conductor. Typically two orthogonal conductors, one formed underneath the magnetic memory bit, hereinafter referred to as the digit line, and one formed on top of the magnetic memory bit, hereinafter referred to as the bit line, are arranged in a cross point matrix to provide magnetic fields for bit programming. Generally, advanced semiconductor processes use copper metal interconnects. The preferred method of forming the copper interconnects is by a damascene or inlaid process. During the process of forming the device, a flux concentrating layer has previously been utilized. The structure is generally formed by first patterning and etching a trench in a dielectric layer, followed by the deposition of a first barrier layer, a flux concentrating layer, a second barrier layer, a copper (Cu) seed layer, and finally a plated copper (Cu) layer. The barrier films are necessary for several reasons. The first barrier layer acts as a diffusion barrier to fast diffusing elements like copper (Cu), and nickel iron (NiFe) alloys. This barrier is typically formed of materials such as tantalum (Ta), tantalum nitride (TaN), tantalum silicon nitride (Ta/Si/N), titanium (Ti), titanium nitride (TiN), or other materials that act to inhibit grain boundary diffusion. This barrier film must also be conductive.

The flux concentrating layer must be of a high permeability and magnetically soft (low coercivity). Magnetostriction must also be low. The nickel iron (NiFe) alloys work well for this flux concentrating layer. The second barrier film acts as a diffusion barrier between the nickel iron (NiFe) alloy and the copper (Cu). Nickel iron (NiFe) alloys and copper (Cu) intermix readily, creating a magnetic dead layer in the high permeability material. This dead layer reduces the effective thickness of the high permeability material reducing its effectiveness. This barrier material has to be conductive and should not have a higher selectivity to polishing chemistries used to remove the copper (Cu) and the nickel iron (NiFe) alloy. Tantalum (Ta) based barriers have such selectivity and thus are not ideal choices for the second barrier because of the increased processing complexity. A second barrier material of cobalt (Co) or cobalt iron (CoFe) is a better material as it acts as a barrier between the nickel iron NiFe) and the copper (Cu) and has similar polish characteristics as nickel iron (NiFe) and copper (Cu). The use of cobalt (Co) or cobalt iron (CoFe) as a second barrier layer also adds to the permeability of the flux concentrating layer, but needs to be thinner than the nickel iron (NiFe) layer because of the higher coercivity. Further information with respect to a magnetic device including a flux concentrating layer can be found in U.S. Pat. No. 5,861,328, entitled "METHOD OF FABRICATING GMR DEVICES", issued Jan. 19, 1999, assigned to the same assignee and incorporated herein by this reference.

One problem in the fabrication of MRAM devices such as those previously described, and more particularly memory cells in general, is the intermixing at elevated temperatures of the cladding layer, typically nickel iron (NiFe) and the copper (Cu) conductor. In addition, advanced CMOS processes use single or dual inlaid copper (Cu) metal interconnects. To overcome these problems, a technique for cladding the copper (Cu) lines formed underneath and on top of the magnetic memory bit that utilizes standard equipment set for inlaid copper (Cu) processing is needed.

Incorporation of a high permeability cladding material on the outside faces of each conductor will focus the magnetic flux toward the bit. The cladding layer using flux concentrating materials will reduce the program current by a factor of approximately two (2), as compared to non-cladded lines. In addition, the cladding layer will provide shielding from stray external fields.

Accordingly it would be highly desirable to provide an improved material stack for adding a flux concentrating layer to copper (Cu) damascene lines. Disclosed is a method for forming cladded inlaid copper (Cu) damascene lines which utilizes standard equipment and processes for the formation of the cladded copper (Cu) damascene line.

Therefore, it is a purpose of the present invention to provide a new and improved method of fabricating magnetoresistive random access memories (MRAMs) containing flux concentrating materials.

It is another purpose of the present invention to provide a new and improved method of fabricating magnetoresistive random access memories (MRAMs) containing flux concentrating materials which includes a technique for cladding the bit line on top of the magnetic memory bit as well as the fabrication of a digit line formed underneath the magnetic memory bit, using standard inlaid processing equipment.

It is a further purpose of the present invention to provide a new and improved method of fabricating magnetoresistive random access memories containing flux concentrating materials with improved structures for forming the cladded lines with barrier layers that focus the magnetic flux upward toward the bit for digit lines formed underneath the magnetic bit and downward toward the bit for bit lines formed on top of the magnetic bit.

SUMMARY OF THE INVENTION

The above problems and others are at least partially solved and the above purposes and others are realized in a method of fabricating magnetic memory devices in which current carrying conductors are formed on top of the magnetic memory bit and underneath the magnetic memory bit. The method of fabricating includes forming an improved material stack by adding a flux concentrating layer to the copper (Cu) damascene line. The structure inhibits diffusion between the nickel iron (NiFe) flux concentrating layer and the copper (Cu) bit line and adds to the permeability of the flux concentrating layer and reduces manufacturing complexity.

During fabrication of the bit line, the flux concentrating layer is added on top of a copper (Cu) damascene line, using manufacturing techniques consistent with copper (Cu) damascene processes. The flux concentrating layer is formed to cover three (3) sides of the bit line for maximum efficiency.

In addition, disclosed is the formation of a current carrying conductor, or a digit line, on an underneath side of the magnetic bit. The formation of the digit line includes forming an improved material stack by adding a flux concentrating layer and barrier layers to the copper (Cu) damascene line.

BRIEF DESCRIPTION OF THE DRAWINGS

Referring to the drawings.

DESCRIPTION OF THE PREFERRED EMBODIMENTS

Figure 1:
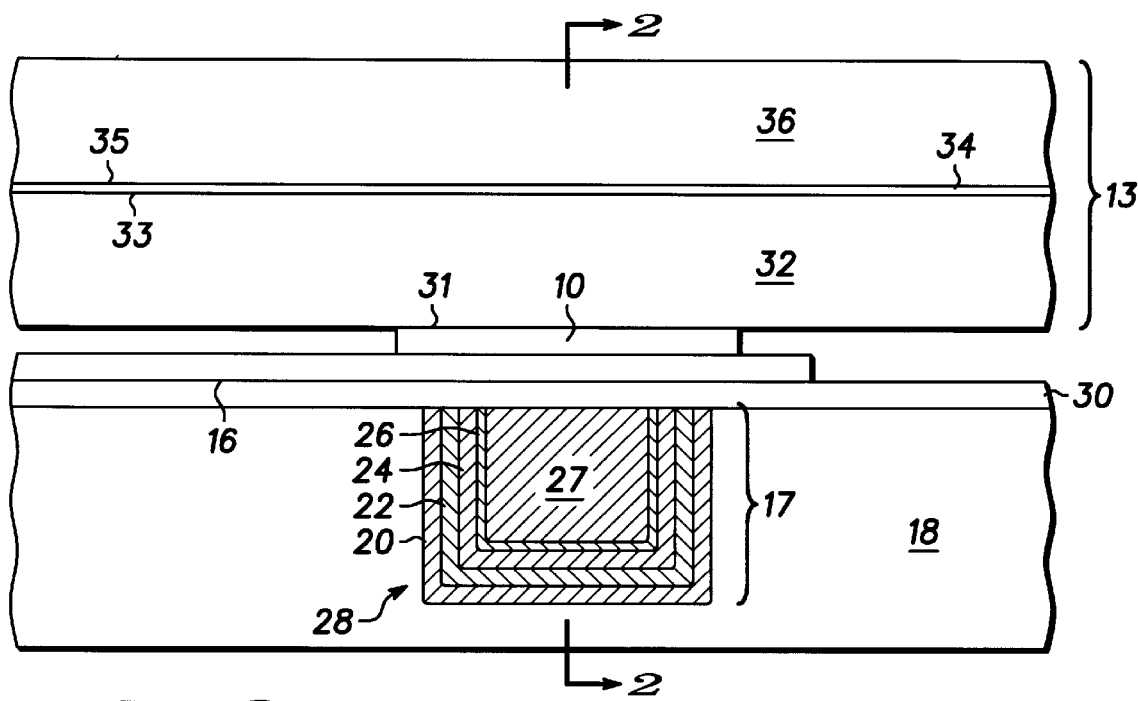
FIGS. 1 through 9 are simplified sectional views illustrating several steps in a method of fabricating magnetic memory devices in accordance with the present invention.

Turning now to the drawings, FIGS. 1 through 9 are simplified sectional views illustrating several steps in a method of fabricating magnetic memory devices in accordance with the present invention. Referring specifically to FIG. 1, illustrated is a first step in the fabrication of a magnetic random access memory (MRAM) device, including an MRAM bit 10. In this specific embodiment MRAM bit 10 is standard MRAM bit formed according to well known practices in the art. While a standard MRAM bit is illustrated herein for convenience, it will be understood by those skilled in the art that many other types of semiconductor devices could be provided. Also, while a single MRAM bit is illustrated for convenience it should be understood that, for example, a complete array of devices or control/driver circuits around the periphery of an array of magnetic memory bits may be formed. Further, FIG. 1 includes a contact metal layer 16 which connects MRAM bit 10 to a transistor (not shown). MRAM bit 10 additionally includes formed thereon an uppermost surface 12 a material stack 13, and formed underneath contact metal layer 16, an inlaid material stack 17. It should also be understood that while FIGS. 1–9 illustrate a method of forming magnetic bit lines and digit lines utilizing dual damascene processes, more particularly, processes including two photo and etch steps, with one plating or deposition step, that anticipated by this disclosure is a method of forming magnetic bit lines and digit lines utilizing single damascene processes, in which one photo and etch step with one plating or deposition step is involved. Accordingly, the applicants intend that the method described herein is applicable to both single and dual damascene processes. In addition, it should be understood that while the drawings illustrate the method of fabricating a bit line in physical contact with the magnetic memory bit, that it is anticipated by this disclosure to form a bit line that is proximate, but not in physical contact, with the magnetic memory bit.

Desired is an improved material stack for adding a flux concentrating layer to copper (Cu) damascene lines formed in conjunction with MRAM bit 10. During fabrication of a digit line, the structure is formed by first patterning and etching a trench in a dielectric layer 18, followed by the deposition of a first barrier layer 20, a flux concentrating layer 22, a second barrier layer 24, a copper (Cu) seed layer 26, and finally a plated copper (Cu) layer 27, together forming a copper damascene line 28. The first barrier layer 20 is formed of a refractory metal, such as tantalum (Ta), tantalum nitride (TaN), tantalum silicon nitride (TaSiN), or the like. Second barrier layer 24 is formed of a cobalt (Co) material or a cobalt iron (CoFe) material and act as diffusion barriers to fast diffusing elements like copper (Cu), and nickel iron (NiFe) alloys. Flux concentrating layer 22 is made of a high permeability and magnetically soft (low coercivity) material. Typically flux concentrating layer 22 is made of nickel iron (NiFe). Next, plated copper 27 is polished forming copper (Cu) damascene digit line 28 and an interlayer 30 of a dielectric material is deposited on an uppermost surface of digit line 28 and dielectric material 18. MRAM bit 10 is next inserted on dielectric interlayer 30.

During fabrication of a bit line formed on top of or proximate magnetic memory bit 10 (discussed presently), a first layer of a dielectric material layer 32 is deposited on surface 31 of or proximate MRAM bit 10. For ease of discussion, the fabrication of a copper (Cu) damascene bit line on a surface and in physical contact with the magnetic memory bit will be discussed with reference to FIGS. 1–9. It should be understood that in an alternative embodiment physical contact between the damascene bit line and magnetic memory bit 10 is not required. Dielectric material layer 32 is typically formed of any type of insulative material, such as a silicon oxide ($SiO_2$) or silicon nitride (SiN) material that is formed on top surface 31 of MRAM device 10 in a standard deposition step generally referred to as a cap layer. Dielectric material layer 32 is next planarized and will serve to form a via (discussed presently), thus allowing for physical contact to MRAM bit 10. It should be understood that in an alternative embodiment, no physical contact is made between MRAM bit 10 and a magnetically coupled bit line (discussed separately). Next, an etch stop layer 34 is formed on an uppermost surface 33 of dielectric material layer 32. Etch stop layer 34 is formed of a material that is selective to fluorine (Fl) based chemistries, or etch stop layer 34 may be formed of a material that provides an endpoint signal for stopping the etch process. A suitable etch stop material to provide the desired etch selectivity is, for example, aluminum oxide ($AlO_2$) or aluminum nitride (AlN) with a thickness in a range of 100 Å to 500 Å, or a silicon nitride (SiN) or silicon oxy-nitride (SiON) layer can be used to provide an end point signal.

A second dielectric layer 36 is deposited on an uppermost surface 35 of etch stop layer 34. Dielectric layer 36 will serve to form the copper (Cu) damascene bit line (discussed presently). Dielectric layer 36 is typically formed of any type of insulative material, such as silicon oxide ($SiO_2$) over silicon nitride ($Si_3N_4$), or a three layer stack consisting of silicon oxide ($SiO_2$) over etch stop layer 34, such as aluminum nitride (AlN) or aluminum oxide ($Al0_3$), over silicon nitride ($Si_3N_4$). In addition, dielectric layer 36 should have properties relating to barriers for moisture and oxidation.

Figure 2:
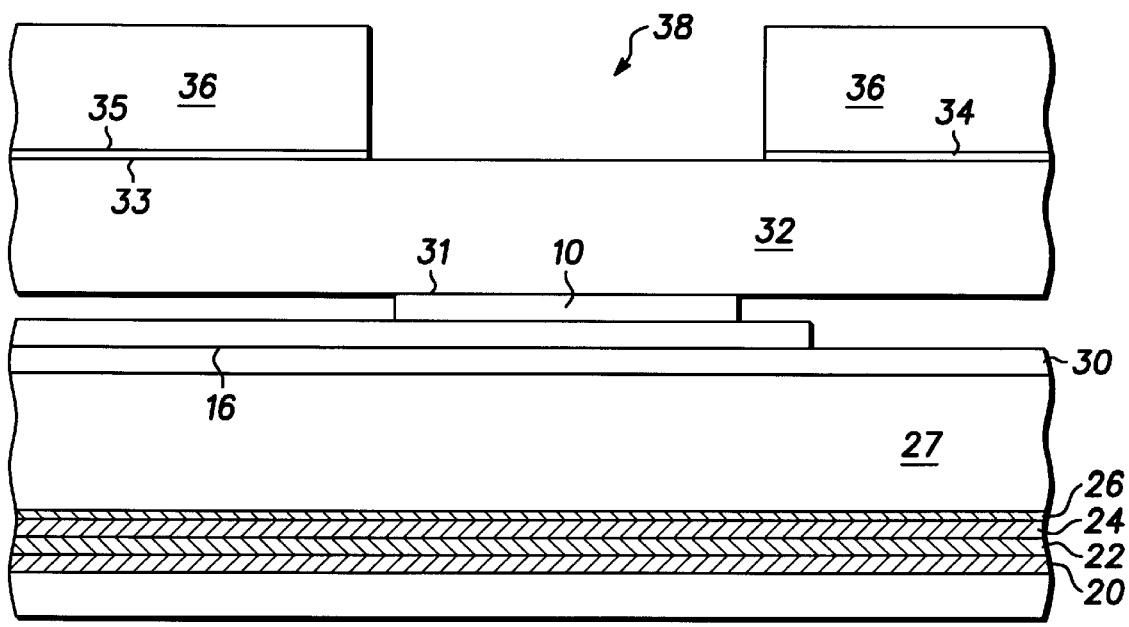
Figure 3:
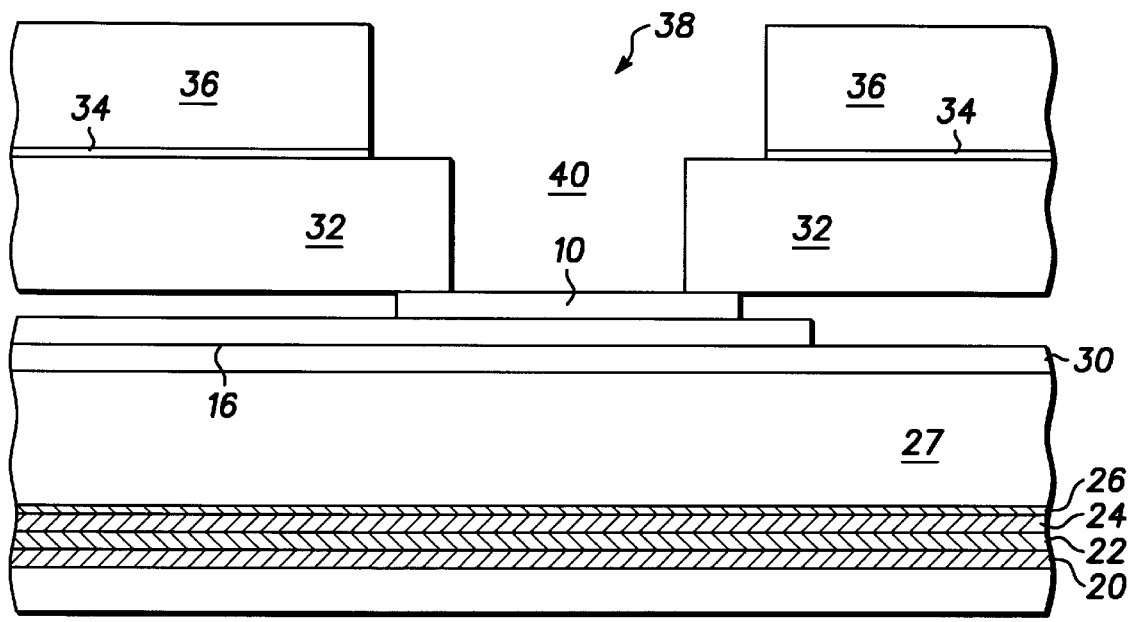

Referring now to FIG. 2, illustrated in simplified sectional view as seen through line 2—2 of FIG. 1, is the next step in the fabrication of a MRAM device including a flux concentrating layer. Dielectric layer 36 is patterned and etched to form a trench 38 for the formation of the copper (Cu) damascene bit line. Dielectric layer 36 is etched utilizing standard etching techniques such as RIE. Dielectric layer 36 is etched such that it is stopped by etch stop layer 34, which as previously described is formed as either a layer of a material which is not amenable to etching, or is simply indicated by a change of material that stops the etching due to an endpoint detection signal. As illustrated in FIG. 3, a separate pattern and etch step is then used to create a via 40 to MRAM bit 10. This etch creates a form or trench for the deposition of a metal system (discussed presently).

Figure 4:
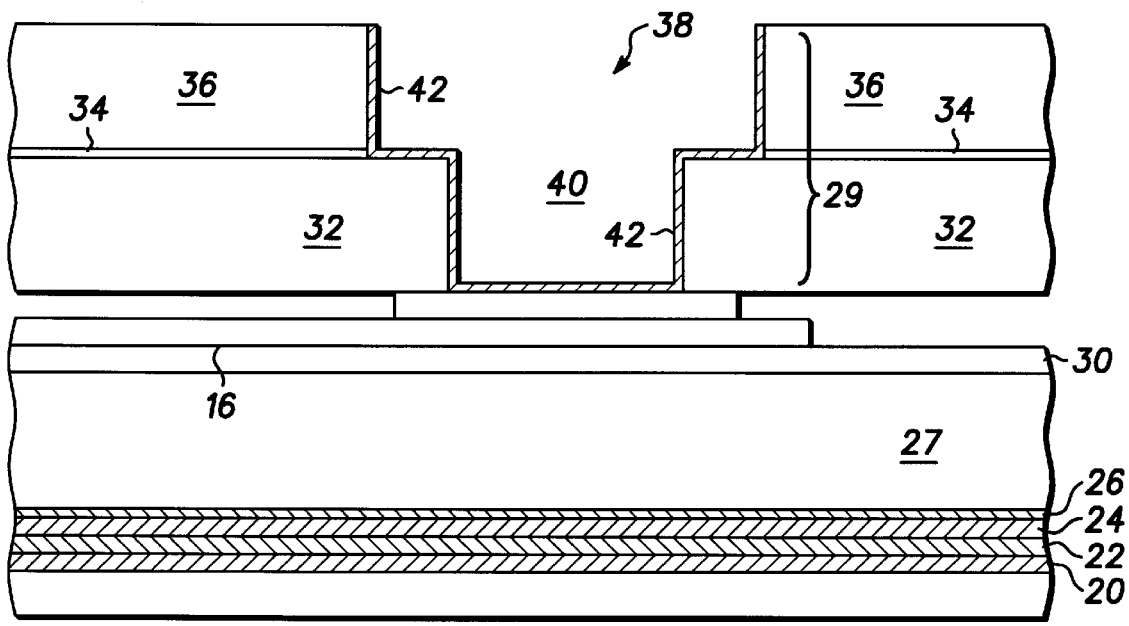
Figure 5:
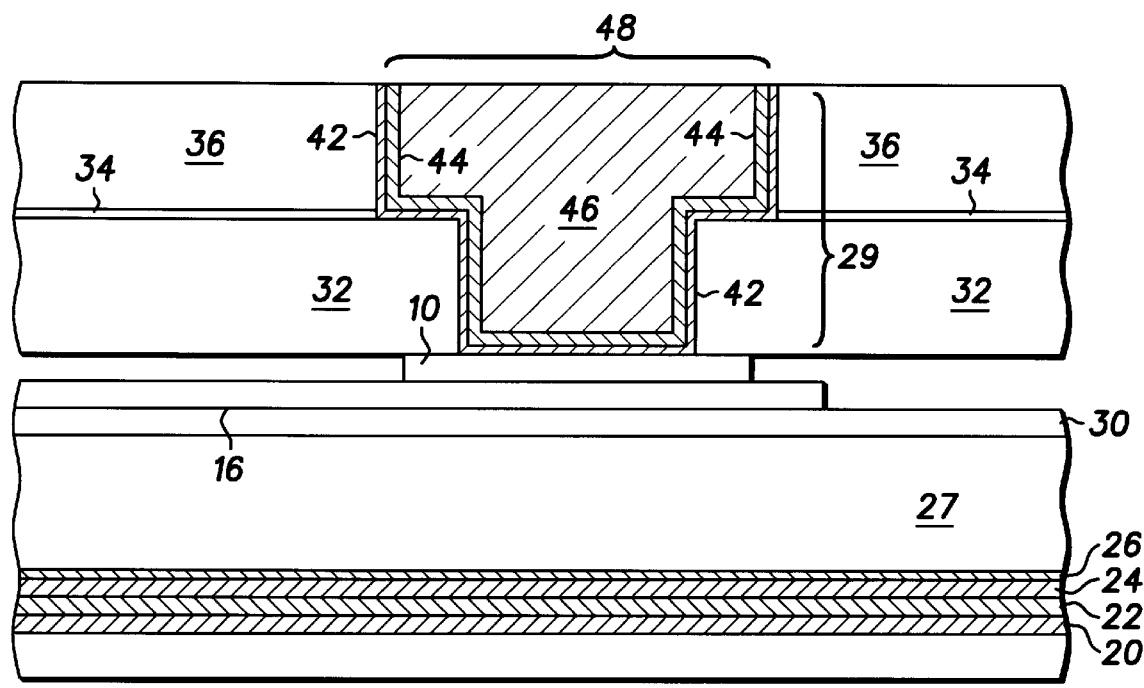

Referring now to FIG. 4, illustrated in simplified sectional view is the next step in the fabrication of a MRAM device including a flux concentrator. More particularly, as illustrated, a metal system, generally referenced 29, is deposited and composed of several layers. Initially, a first barrier layer 42 is deposited within trench 38 and via 40 formed therein. First barrier layer 42 is formed of tantalum (Ta), tantalum nitride (TaN), tantalum silicon nitride (TaSiN), or any other suitable material. First barrier layer 42 is deposited using either physical vapor deposition (PVD) or ionized metal plasma (IMP) techniques. As illustrated in FIG. 5, a seed layer 44 of copper (Cu) is next deposited in trench 38 and via 40 (as shown in FIG. 4) using either PVD, CVD, or IMP techniques. Seed layer 44 of copper (Cu) if deposited by PVD or IMP techniques, will serve to form the copper (Cu) seed layer for electroplating the damascene bit line and is defined as part of a metal system 29. Next, a copper (Cu) material is electroplated to form plated copper (Cu) material 46. Together seed layer 44 and plated copper material 46 form a copper system 48. Any excess copper (Cu) is removed in the regions above trench 38 by chemical mechanical polishing (CMP) or the like.

Figure 6:
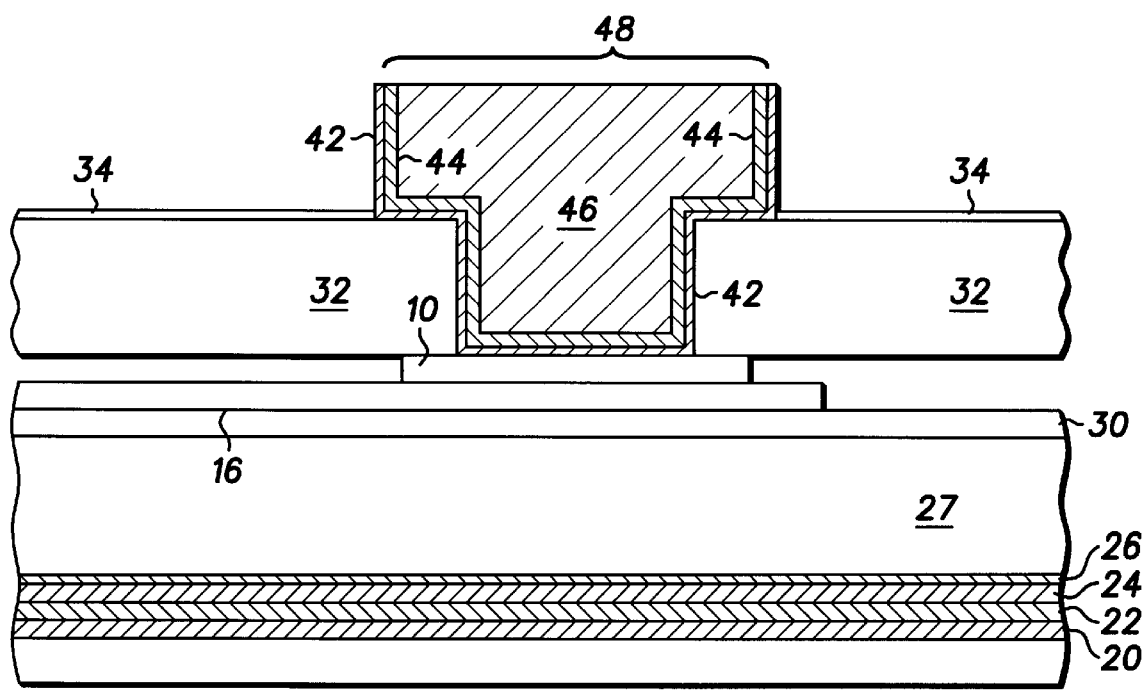

Referring now to FIG. 6, dielectric layer 36 is removed down to etch stop layer 34. Dielectric layer 36 is removed by a dry etch process using fluorine (Fl) based chemistries or wet chemistry.

Figure 7:
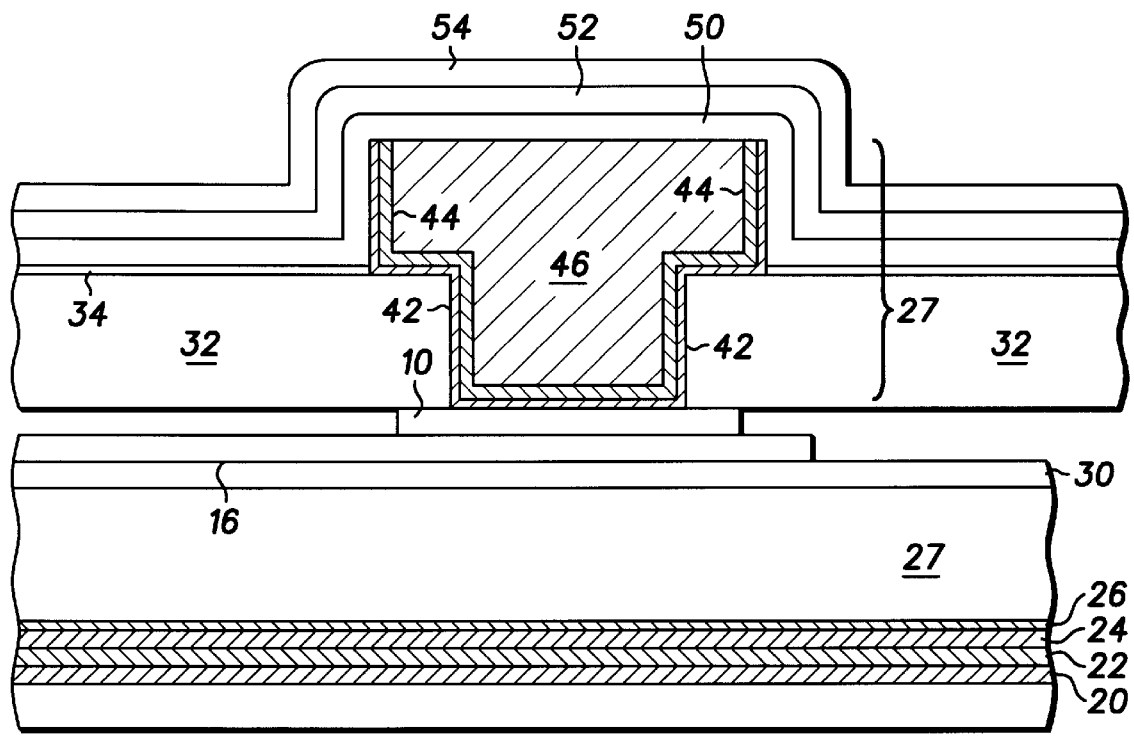

Next, as illustrated in FIG. 7, a first outside barrier layer 50 is deposited on copper system 48. First outside barrier layer 50 is formed of a refractory metal material, such as cobalt (Co), cobalt iron (CoFe), tantalum (Ta), tantalum nitride (TaN), or other suitable material. A flux concentrating layer 52, is next deposited on the surface of first outside barrier layer 50. Flux concentrating layer 52 is formed of a high permeability magnetic material. Flux concentrating layer 52 has the characteristic of concentrating magnetic flux produced by the current flowing in the conductor, therefore, reducing the amount of current required to produce the desired action. Flux concentrating layer 52 is an electrically conducting magnetic material having high permeability, such as nickel iron (NiFe), or any suitable material having sufficiently high permeability to concentrate the magnetic flux in the desired area and be metallurgically compatible with the remaining material structure.

Figure 8:
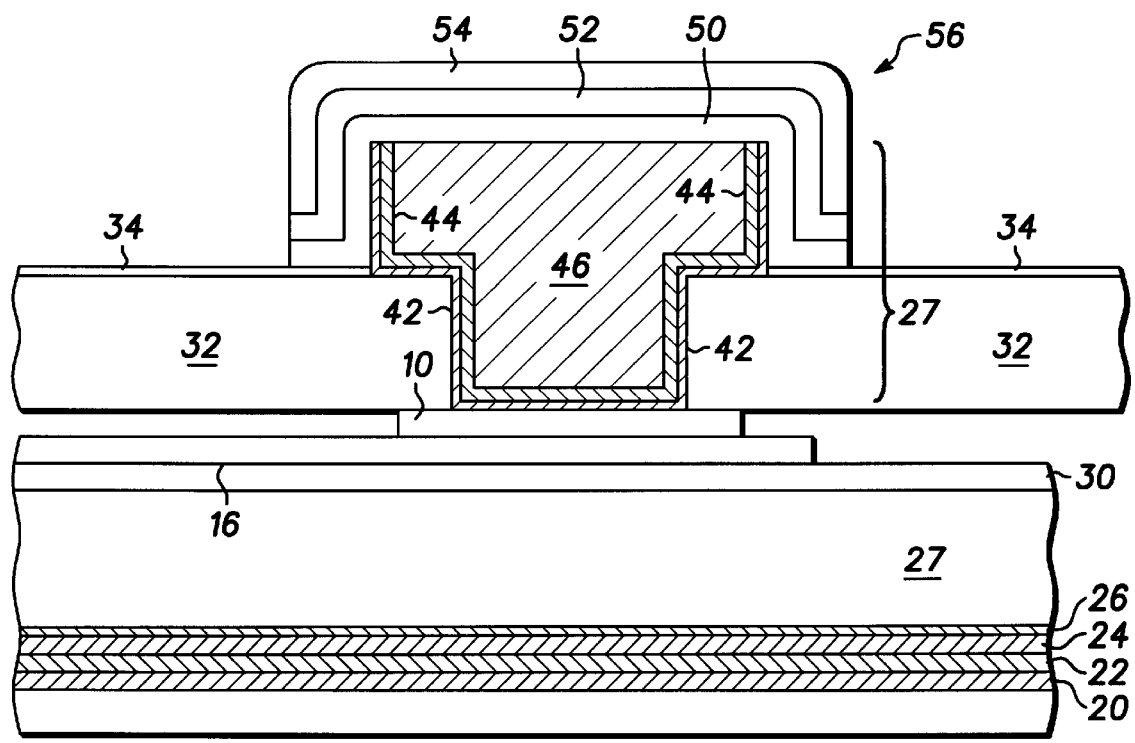

Next, a second outside barrier layer 54 is deposited on the surface of flux concentrating material layer 52. Second outside barrier layer 54 is preferably formed of tantalum (Ta), tantalum nitride (TaN), tantalum silicon nitride (TaSiN), or similar material. As illustrated in FIG. 8, first outside barrier layer 50, flux concentrating layer 52 and second outside barrier layer 54 are next patterned and etched to define a cladded copper (Cu) damascene bit line 56.

Figure 9:
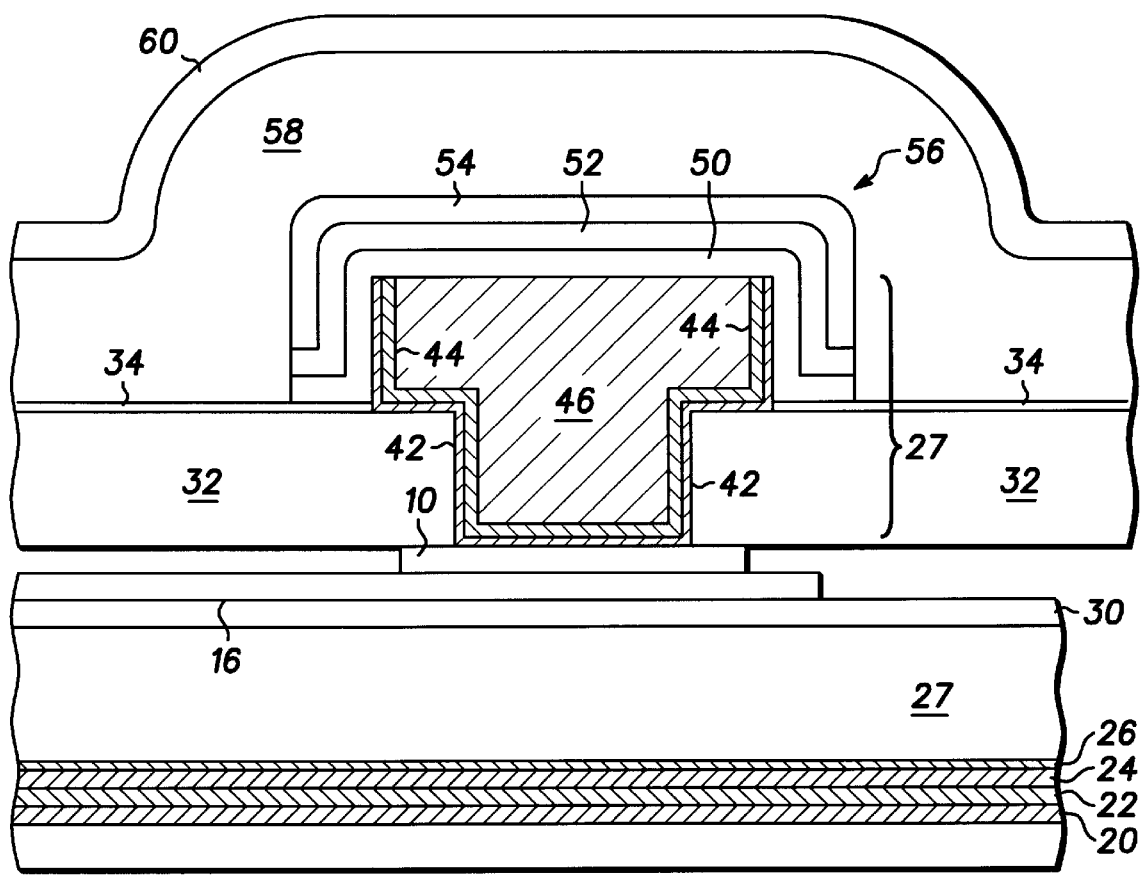

Finally, as illustrated in FIG. 9, a passivation layer 58 is deposited over material stack 56, including flux concentrating layer 52. Any conventional passivation layer can be used as layer 58. Optionally a shielding layer 60, formed of a layer of a highly permeable material, is deposited on passivation layer 58. Shielding layer 60 when formed of a highly permeable material includes forming a layer with one of nickel (Ni), and nickel iron (NiFe). Also, openings (not shown) may be cut in passivation layer 58 and shielding layer 60, for the purpose of probing and making electrical contacts to the various circuits. The purpose of shielding layer 60 is to provide additional protection from stray magnetic fields, above the level of protection provided by flux concentrating layer 52.

Accordingly, an improved method of fabricating flux concentrating layers for use with magnetoresistive random access memories is disclosed. Moreover, the present invention provides for an improved method of fabricating a copper (Cu) damascene digit line including flux concentrating properties and barrier properties in which the digit line is formed underneath the magnetic memory element and the fabricating of a material stack for adding flux concentrating properties to a copper (Cu) damascene bit line in which the bit line is formed on top of the magnetic memory element. The new and improved method of fabricating memories includes incorporating a high permeability cladding material on the outside faces of each conducting line so as to focus the magnetic flux toward the magnetic bit. The cladding layers using flux concentrating materials will reduce the program current by a factor of approximately two (2), as compared to non-cladded lines. In addition, the cladding layers will provide shielding from stray external fields.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a flux concentrator for use in magnetic memory devices comprising the steps of:
    forming a cladded digit line including a first barrier layer, a flux concentrating layer, a second barrier layer and a copper (Cu) conducting line;
    depositing a dielectric layer on an uppermost surface of the cladded digit line
    providing at least one magnetic memory bit on the dielectric layer; and
    forming a cladded bit line including a copper (Cu) conducting line, a first outside barrier layer, a flux concentrating layer, and a second outside barrier layer.

2. A method of fabricating a flux concentrator for use in magnetic memory devices as claimed in claim 1 wherein the step of forming the cladded digit line includes the step of forming the first barrier layer with a refractory metal material and the second barrier layer with one of a cobalt (Co) material or a cobalt iron (CoFe) material and forming the flux concentrating layer of a nickel iron (NiFe) material.

3. A method of fabricating a flux concentrator for use in magnetic memory devices as claimed in claim 2 wherein the step of forming the cladded bit line includes the step of forming the first outside barrier layer with a refractory metal material and the second outside barrier layer with one of a cobalt (Co) material or a cobalt iron (CoFe) material and forming the flux concentrating layer of a nickel iron (NiFe) material.

4. A method of fabricating a flux concentrator for use in magnetic memory devices as claimed in claim 1 wherein the step of forming the cladded digit line includes forming the cladded bit line using a single damascene process.

5. A method of fabricating a flux concentrator for use in magnetic memory devices as claimed in claim 1 wherein the step of forming the cladded digit line includes forming the cladded bit line using a dual damascene process.

6. A method of fabricating a flux concentrator for use in magnetic memory devices as claimed in claim 1 wherein the step of forming the cladded bit line includes forming the cladded digit line using a single damascene process.

7. A method of fabricating a flux concentrator for use in magnetic memory devices as claimed in claim 1 wherein the step of forming the cladded bit line includes forming the cladded digit line using a dual damascene process.

8. A method of fabricating a flux concentrator for use in magnetic memory devices comprising the steps of:
    providing at least one magnetic memory bit;
    depositing a bottom dielectric layer and a top dielectric layer proximate the at least one magnetic memory bit;
    forming at least one trench in the top dielectric layer and the bottom dielectric layer;
    depositing a first barrier layer in the at least one trench;
    depositing a metal system on a surface of the first barrier layer, the metal system including a flux concentrating layer; and patterning the metal system to define a copper (Cu) damascene bit line.

9. A method of fabricating a flux concentrator for use in magnetic memory devices as claimed in claim 8 wherein the step of forming at least one of the bottom dielectric layer and the top dielectric layer with at least one layer of material includes forming a layer of silicon nitride (SiN) by one of plasma enhanced chemical vapor deposition (PECVD) or physical vapor deposition (PVD).

10. A method of fabricating a flux concentrator for use in magnetic memory devices as claimed in claim 9 wherein the step of depositing the metal system includes depositing a copper (Cu) seed material in at least one trench, depositing a plated copper (Cu) material on a surface of the copper (Cu) seed material, and buffing and polishing the plated copper (Cu) material to define a copper (Cu) damascene bit line.

11. A method of fabricating a flux concentrator for use in magnetic memory devices as claimed in claim 10 wherein the bottom dielectric layer and the top dielectric layer are formed on a top surface and in physical contact with the at least one magnetic memory bit.

12. A method of fabricating a flux concentrator for use in magnetic memory devices as claimed in claim 11 wherein the steps of forming at least one trench in the top dielectric layer and the bottom dielectric layer includes the step of forming the trench through the bottom dielectric layer and the step of depositing a first barrier layer in the at least one trench and depositing a metal system on a surface of the first barrier layer includes the step of depositing the metal system in physical contact with the at least one magnetic memory bit.

13. A method of fabricating a flux concentrator for use in magnetic memory devices as claimed in claim 12 further including the step of fabricating a cladded digit line including a first barrier layer, a flux concentrating layer and a second barrier layer, underneath the at least one magnetic memory bit prior to the step of providing the at least one magnetic memory bit and fabricating of the copper damascene bit line.

14. A method of fabricating a flux concentrator for use in magnetic memory devices as claimed in claim 10 wherein the step of depositing the metal system further includes etching to remove the top dielectric layer, depositing a first outside barrier layer adjacent the plated copper (Cu) material, depositing a flux concentrating layer of a permeable magnetic material adjacent the first outside barrier layer, depositing a second outside barrier layer adjacent the flux concentrating layer.

15. A method of fabricating a flux concentrator for use in magnetic memory devices as claimed in claim 14 further including the step of forming an etch stop layer between the bottom dielectric layer and the top dielectric layer providing etch stop selectivity between the bottom dielectric layer and the top dielectric layer.

16. A method of fabricating a flux concentrator for use in magnetic memory devices comprising the steps of:
providing a dielectric material;
forming a cladded digit line including a first barrier layer, a flux concentrating layer, a second barrier layer and a copper (Cu) conducting line within a portion of the dielectric material;
depositing a dielectric layer on an uppermost surface of the cladded digit line;
providing at least one magnetic memory bit on the dielectric layer; and
forming a cladded bit line including a first outside barrier layer, a flux concentrating layer, a second outside barrier layer and a copper (Cu) line, wherein the step of forming the cladded bit line includes the steps of:
depositing a bottom dielectric layer and a top dielectric layer on a top surface of the magnetic memory bit, the bottom dielectric layer formed of an insulated material and the top dielectric layer formed of an insulated material;
etching at least one trench in the top dielectric layer to the bottom dielectric layer to form a trench for the formation of a damascene bit line;
forming at least one via in the bottom dielectric layer to the magnetic memory bit to make physical contact with the magnetic memory bit;
depositing a first barrier layer in the at least one trench and the at least one via to the magnetic memory bit;
depositing a metal system on a surface of the first barrier layer, the step of depositing the metal system including the step of depositing a copper (Cu) seed material in the at least one trench and via, depositing a plated copper (Cu) material on a surface of the copper (Cu) seed material, and buffing and polishing the plated copper (Cu), removing the top dielectric of the copper system, depositing of the first outside barrier layer, the flux concentrating layer, and the second outside barrier layer on a surface of the plated copper (Cu); and
patterning the metal system to define a copper (Cu) damascene bit line.

17. A method of fabricating a flux concentrator for use in magnetic memory devices as claimed in claim 16 wherein the step of forming a cladded digit line includes forming the barrier layers with one of copper (Cu) or copper iron (CuFe).

18. A method of fabricating a flux concentrator for use in magnetic memory devices as claimed in claim 17 wherein the step of forming the cladded digit line includes one of a dual damascene process or a single damascene process.

19. A method of fabricating a flux concentrator for use in magnetic memory devices as claimed in claim 16 wherein the step of forming the copper (Cu) damascene bit line includes one of a dual damascene process or a single damascene process.

20. A method of fabricating a flux concentrator for use in magnetic memory devices as claimed in claim 16 further including the step of depositing an etch stop layer on a surface of the bottom dielectric layer, the etch stop layer selective to fluorine (Fl) based chemistries.

* * * * *

UNITED STATES PATENT AND TRADEMARK OFFICE
CERTIFICATE OF CORRECTION

PATENT NO.    : 6,211,090 B1
DATED         : April 3, 2001
INVENTOR(S)   : Durlam et al.

It is certified that error appears in the above-identified patent and that said Letters Patent is hereby corrected as shown below:

<u>Column 1,</u>
Line 4, after the title, please add as a new first paragraph the following paragraph:
-- This invention was made with Government support under Agreement No. MDA972-96-3-0016 awarded by DARPA. The Government has certain rights in the invention. --

Signed and Sealed this

Fourth Day of November, 2003

JAMES E. ROGAN
*Director of the United States Patent and Trademark Office*